US007575943B2

(12) United States Patent
Kim et al.

(10) Patent No.: US 7,575,943 B2
(45) Date of Patent: Aug. 18, 2009

(54) QUANTUM DOT LASER DIODE AND METHOD OF MANUFACTURING THE SAME

(75) Inventors: Jin Soo Kim, Daejeon (KR); Jin Hong Lee, Daejeon (KR); Sung Ui Hong, Daejeon (KR); Ho Sang Kwack, Chungcheongnam-do (KR); Byung Seok Choi, Daejeon (KR); Dae Kon Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 46 days.

(21) Appl. No.: 11/607,516

(22) Filed: Dec. 1, 2006

(65) Prior Publication Data

US 2007/0128839 A1      Jun. 7, 2007

(30) Foreign Application Priority Data

Dec. 6, 2005 (KR) .............. 10-2005-0118104
Sep. 7, 2006 (KR) .............. 10-2006-0086028

(51) Int. Cl.
*H01L 21/00* (2006.01)
(52) U.S. Cl. ............... 438/22; 438/32; 438/46; 257/E21.001
(58) Field of Classification Search ............. 438/22, 438/32, 46
See application file for complete search history.

(56) References Cited

U.S. PATENT DOCUMENTS 6,033,972 A     3/2000  Ro et al.
6,329,668 B1   12/2001  Razeghi
6,795,466 B1    9/2004  Takei et al.
6,912,239 B2    6/2005  Okunuki
7,282,732 B2 * 10/2007  Gray et al. .............. 257/14

(Continued)

FOREIGN PATENT DOCUMENTS

JP         11-307856        11/1999

(Continued)

OTHER PUBLICATIONS

"Effects of a thin InGaAs layer on InAs quantum dots embedded in InAl(Ga)As." Jin Soo Kim et al. Applied Physics Letters. © 2003 American Institute of Physics. vol. 83, No. 18. pp. 3785-3787.

(Continued)

*Primary Examiner*—Jack Chen
(74) *Attorney, Agent, or Firm*—Ladas & Parry LLP

(57) ABSTRACT

Provided are a quantum dot laser diode and a method of manufacturing the same. The method of manufacturing a quantum dot laser diode includes the steps of: forming a grating structure layer including a plurality of gratings on a substrate; forming a first lattice-matched layer on the grating structure layer; forming at least one quantum dot layer having at least one quantum dot on the first lattice-matched layer; forming a second lattice-matched layer on the quantum dot layer; forming a cladding layer on the second lattice-matched layer; and forming an ohmic contact layer on the cladding layer. Consequently, it is possible to obtain high gain at a desired wavelength without affecting the uniformity of quantum dots, so that the characteristics of a laser diode can be improved.

5 Claims, 5 Drawing Sheets

U.S. PATENT DOCUMENTS

2004/0216660 A1* 11/2004 Kim et al. .................... 117/84

FOREIGN PATENT DOCUMENTS

| JP | 2002-158399 | 5/2002 |
| KR | 1020000063836 | 11/2000 |
| KR | 1020060082495 | 7/2006 |
| KR | 1020060091509 | 8/2006 |

OTHER PUBLICATIONS

"Effects of high potential barrier on InAs quantum dots and wetting layer." Jin Soo Kim et al. Journal of Applied Physics. © 2002 American Institute of Physics. vol. 91, No. 8. pp. 5055-5059.

"InAs/GaInAs quantum dot DFB lasers emitting at 1.3 μm." F. Klopf et al. Electronics Letters. May 10, 2001. vol. 37, No. 10. pp. 634-636.

"Surface effects on shape, self-organization and photoluminescence of InAs islands grown on InAIAs/InP(001)," J. Brault et al. Journal of Applied Physics. © 2002 American Institute of Physics. vol. 92, No. 1. pp. 506-510.

* cited by examiner

QUANTUM DOT LASER DIODE AND METHOD OF MANUFACTURING THE SAME

CROSS-REFERENCE TO RELATED APPLICATION

This application claims priority to and the benefit of Korean Patent Application Nos. 2005-118104, filed Dec. 6, 2005, and 2006-86028, filed Sep. 7, 2006, the disclosures of which are incorporated herein by reference in their entirety.

BACKGROUND

1. Field of the Invention

The present invention relates to a distributed feedback quantum dot laser diode and a method of manufacturing the same, and more particularly, to a quantum dot laser diode in which a grating structure is formed under a quantum dot and a method of manufacturing the same.

2. Discussion of Related Art

Recently, quantum dot laser diodes have been developed that use quantum dots grown by a self-assembly method in an active layer. Specifically, such quantum dot laser diodes have a broad-area structure, a ridge-waveguide structure, a buried hetero-structure, a structure having an externally patterned metal grating and so on.

However, according to recent research tendency of growing In(Ga)As quantum dots on an InP substrate by the self-assembly method, it is relatively hard to form uniform quantum dots in comparison with an In(Ga)As quantum dot structure formed on a GaAs substrate. In addition, when quantum dots having relatively low uniformity are applied to a laser diode, gain that can be obtained at a desired lasing wavelength is reduced. In this reason, it is hard to obtain excellent device characteristics. Therefore, current research is intended to provide a method for enhancing the uniformity of quantum dots in a desired wavelength region or improving device characteristics at a specific wavelength in order to improve device characteristics upon manufacturing a laser diode using In(Ga)As quantum dots as an active layer on an InP substrate.

SUMMARY OF THE INVENTION

The present invention is directed to a quantum dot laser diode having a grating structure formed on a substrate to provide high gain in a desired wavelength region without affecting the uniformity of quantum dots, and a method of manufacturing the same.

One aspect of the present invention provides a method of manufacturing a quantum dot laser diode, comprising the steps of: forming a grating structure layer including a plurality of gratings on a substrate; forming a first lattice-matched layer on the grating structure layer; forming at least one quantum dot layer having at least one quantum dot on the first lattice-matched layer; forming a second lattice-matched layer on the quantum dot layer; forming a cladding layer on the second lattice-matched layer; and forming an ohmic contact layer on the cladding layer.

In the step of forming at least one quantum dot layer, one of a metal-organic chemical vapor deposition (MOCVD) method, a molecular beam epitaxy (MBE) method, an atomic layer epitaxy (ALE) and a chemical beam epitaxy (CBE) method may be used. The quantum dot may be formed of In(Ga)As. In the steps of forming the first and second lattice-matched layers, the first and second lattice-matched layers may be formed of a group III-V compound.

In the steps of forming the first and second lattice-matched layers, the first and second lattice-matched layers may be formed to have a separate confinement hetero-structure (SCH) having a step index (SPIN)-shaped waveguide. When the first and second lattice-matched layers are formed in the SPIN-shaped SCH structure, a quantum well may be inserted into the SPIN SCH structure and formed to symmetrically or asymmetrically surround the quantum dot.

In the steps of forming the first and second lattice-matched layers, the first and second lattice-matched layers may be formed to have an SCH structure having a graded index (GRIN)-shaped waveguide. When the first and second lattice-matched layers are formed in the GRIN-shaped SCH structure, a quantum well may be inserted into the GRIN SCH structure and formed to symmetrically or asymmetrically surround the quantum dot.

Another aspect of the present invention provides a quantum dot laser diode comprising: a grating structure layer formed on a substrate and including a plurality of gratings; a first lattice-matched layer formed on the grating structure layer; at least one quantum dot layer formed on the first lattice-matched layer and including at least one quantum dot; a second lattice-matched layer formed on the quantum dot layer; a cladding layer formed on the second lattice-matched layer; and an ohmic contact layer formed on the cladding layer.

The substrate may be an InP substrate or a GaAs substrate. The quantum dot may be formed of In(Ga)As. The first and second lattice-matched layers may be formed of a group III-V compound. The first and second lattice-matched layers may have an SCH structure having a SPIN or GRIN-shaped waveguide.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

FIGS. 1A to 1F are manufacturing process diagrams illustrating steps for manufacturing a quantum dot laser diode according to an exemplary embodiment of the present invention.

Figure 1A:
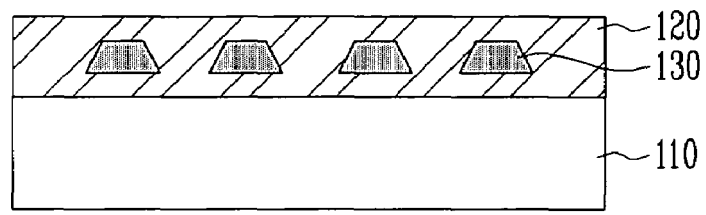
FIGS. 1A to 1F are manufacturing process diagrams illustrating steps for manufacturing a quantum dot laser diode according to an exemplary embodiment of the present invention.

Referring to FIGS. 1A to 1F, in order to manufacture a quantum dot laser diode 100, a substrate 110 is prepared first, and a grating structure layer 120 including a plurality of gratings 130 is formed on the substrate 110 (see FIG. 1A). In general, the gratings 130 can be used for injecting photons and leading the stimulated emission. In this embodiment, the layer including the gratings 130 is called the grating structure layer 120, but the grating structure layer 120 can serve as a cladding layer formed to confine light. The substrate 110 constituting the quantum dot diode 100 is an InP substrate or a GaAs substrate.

Figure 1B:
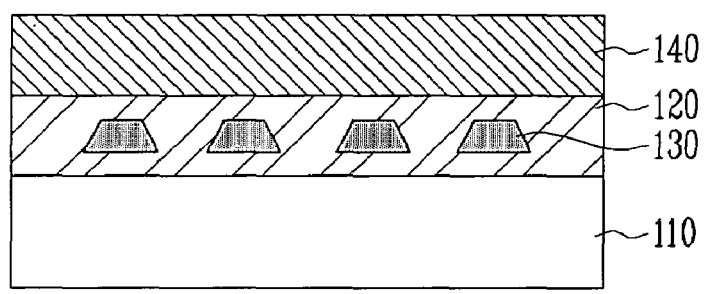

Referring to FIG. 1B, a first lattice-matched layer 140 is formed on the grating structure layer 120. The first lattice-matched layer 140 is a layer for growing In(Ga)As quantum dots using a self-assembly method on the InP substrate 110 on which the grating structure layer 120 is formed. The first lattice-matching layer may be formed by lattice-matching InAlGaAs and In(Ga,As)P. The first lattice-matched layer 140 has a heterojunction structure formed by stacking at least two material layers formed of a group III-V compound, e.g., In, Al, Ga, etc. in group III, and As, P, etc. in group V, and serves as a barrier layer. In addition, the first lattice-matched layer 140 may be formed to have a separate confinement hetero (SCH) structure having a step index (SPIN)-shaped waveguide or a graded index (GRIN)-shaped waveguide.

Figure 1C:
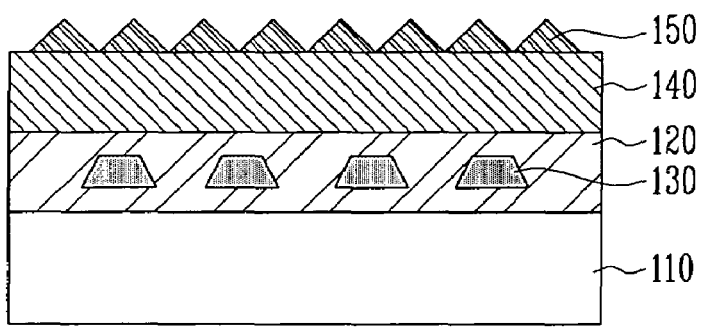

Referring to FIG. 1C, a quantum dot layer 150 consisting of In(Ga)As quantum dots is formed on the first lattice-matched layer 140. The quantum dot layer 150 consists of the In(Ga)As quantum dots obtained by growing In(Ga)As using the self-assembly mechanism, and the quantum dots may be grown by one of a metal-organic chemical vapor deposition (MOCVD) method, a molecular beam epitaxy (MBE) method, an atomic layer epitaxy (ALE) method and a chemical beam epitaxy (CBE) method. In this embodiment, the quantum dots constituting the quantum dot layer are not spaced apart from each other but may be formed at predetermined intervals in a quantum dot structure.

Meanwhile, although not disclosed in this embodiment and drawings, when the first lattice-matched layer 140 is formed to have a SPIN-shaped SCH structure, quantum dots in a quantum well (DWELL) formed by inserting quantum wells in the SPIN SCH structure may be symmetrically or asymmetrically surrounded by the quantum wells. In the same manner, when the first lattice-matched layer 140 is formed to have a GRIN-shaped SCH structure, the quantum dots may be symmetrically or asymmetrically surrounded by quantum wells inserted into the GRIN SCH structure. In this embodiment, one quantum dot layer is formed, but a plurality of quantum dot layers having a plurality of quantum dots may be stacked.

Figure 1D:
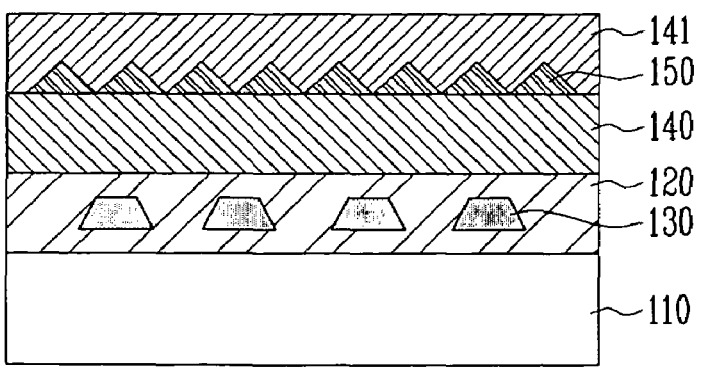

Referring to FIG. 1D, after the quantum dot layer 150 including a plurality of quantum dots is formed, a second lattice-matched layer 141 is formed on the quantum dot layer 150. The second lattice-matched layer 141 is the same as the first lattice-matched layer 140 in structure and function and also may be formed into a barrier layer or to have an SCH structure.

Figure 1E:
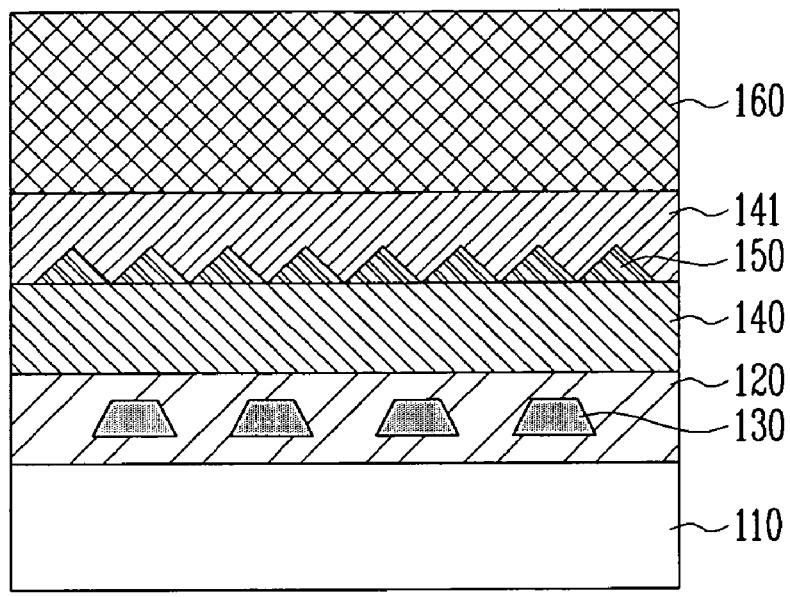

Referring to FIG. 1E, after the second lattice-matched layer 141 is formed on the quantum dot layer 150 having the quantum dot structure, a cladding layer 160 capable of serving to confine light emitted from the quantum dot layer 150 is formed. The cladding layer 160 may be formed of InAl(Ga)As or In(Ga,As)P.

Figure 1F:
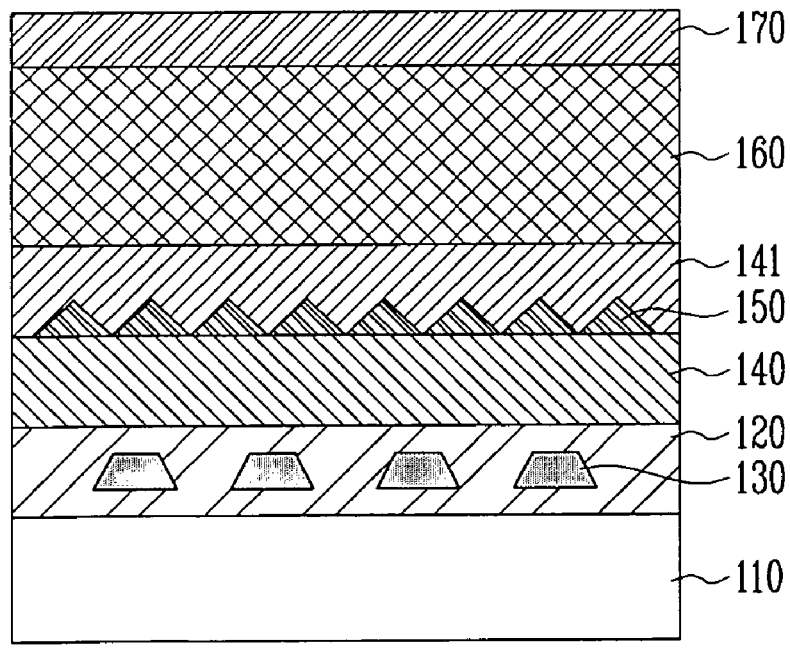

Referring to FIG. 1F, an ohmic contact layer 170 is formed on the cladding layer 160. The ohmic contact layer 170 is for adjusting an ohmic contact and formed of InGaAs in this embodiment.

Figure 2A:
FIG. 2A is a cross-sectional image of a quantum dot laser diode taken by a scanning electron microscope (SEM) according to an exemplary embodiment of the present invention.
Figure 2B:
FIG. 2B is an image of a surface of a quantum dot laser diode taken by an optical microscope according to an exemplary embodiment of the present invention.

FIG. 2A is a cross-sectional image of a quantum dot laser diode taken by a scanning electron microscope (SEM) according to an exemplary embodiment of the present invention, and FIG. 2B is an image of a surface of a quantum dot laser diode taken by an optical microscope according to an exemplary embodiment of the present invention.

Referring to FIG. 2A, the quantum dot laser diode according to an exemplary embodiment of the present invention includes a grating structure layer 120 including gratings 130, and a quantum dot layer 150 including In(Ga)As quantum dots and formed on the grating structure layer 120. Referring to FIG. 2B, a quantum dot laser diode is shown which is manufactured by growing a distributed feedback laser diode using the quantum dot layer 150 formed on a grating structure layer and having an In(Ga)As quantum dot structure and InAlGaAs—InAlAs material series and then forming it in a ridge-waveguide shape A.

Figure 3:
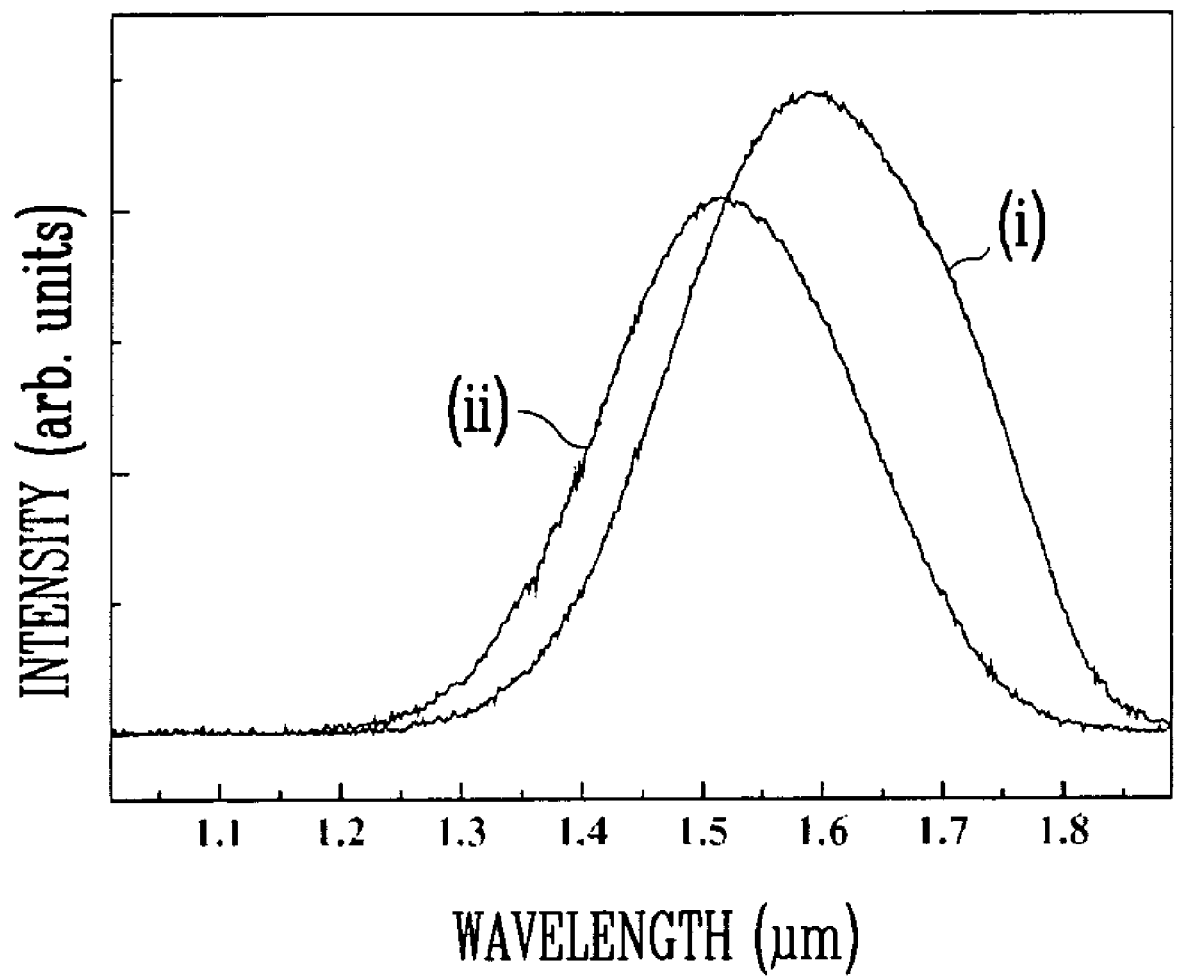
FIG. 3 illustrates light emission spectrum graph (i) of a quantum dot laser diode including a grating structure layer and light emission spectrum graph (ii) of a quantum dot laser diode not including a grating structure layer according to an exemplary embodiment of the present invention.

FIG. 3 illustrates light emission spectrum graph (i) of a quantum dot laser diode including a grating structure layer and light emission spectrum graph (ii) of a quantum dot laser diode not including a grating structure layer according to an exemplary embodiment of the present invention. Light emission spectrum experiments were performed at room temperature under the same condition, e.g., a quantum dot layer growth condition, except that gratings are included (i) or not (ii).

Referring to FIG. 3, the x-axis indicates wavelength ($\mu m$), and the y-axis indicates intensity (arb. units). Graph (i) is a light emission spectrum graph of a quantum dot laser diode in which a grating structure layer is included and a 7 quantum dot layer is stacked on the grating structure layer. And, graph (ii) is a light emission spectrum graph of a quantum dot laser diode in which a grating structure layer is not included and a 7 quantum dot layer is stacked. From graphs (i) and (ii), it can be seen that the quantum dot laser diode including gratings can provide higher gain than the quantum dot laser diode not including gratings in a desired wavelength region of about 1.55 $\mu m$ or above. The above experiments used 7 quantum dots but are not limited hereto.

Figure 4A:
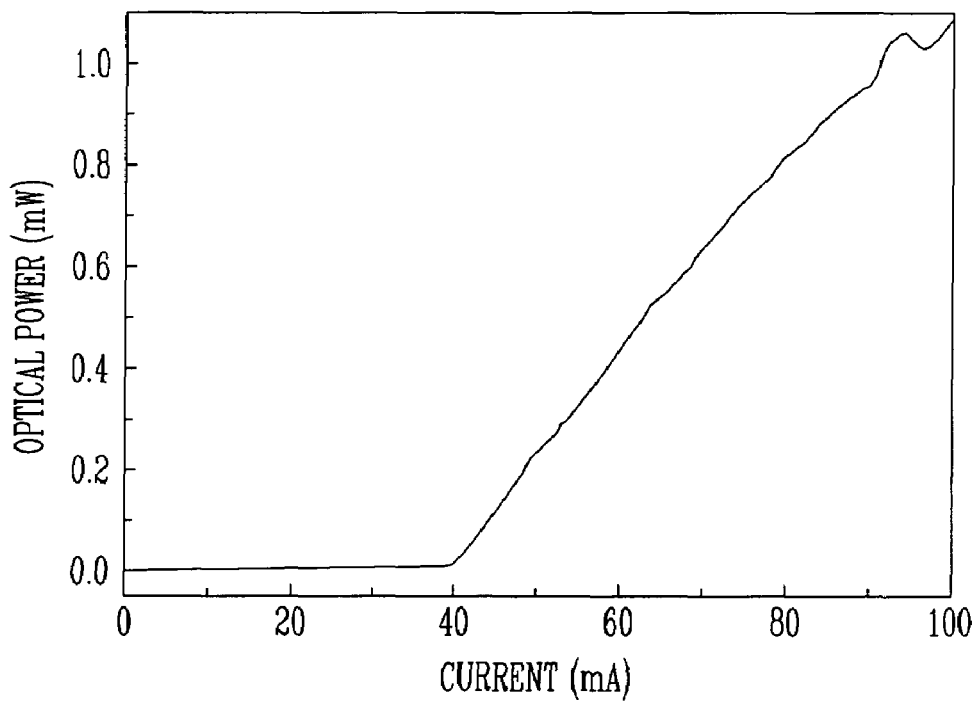
FIG. 4A is a graph showing optical power as a function of applied current measured under a continuous wave condition at room temperature in a quantum dot laser diode manufactured according to an exemplary embodiment of the present invention.
Figure 4B:
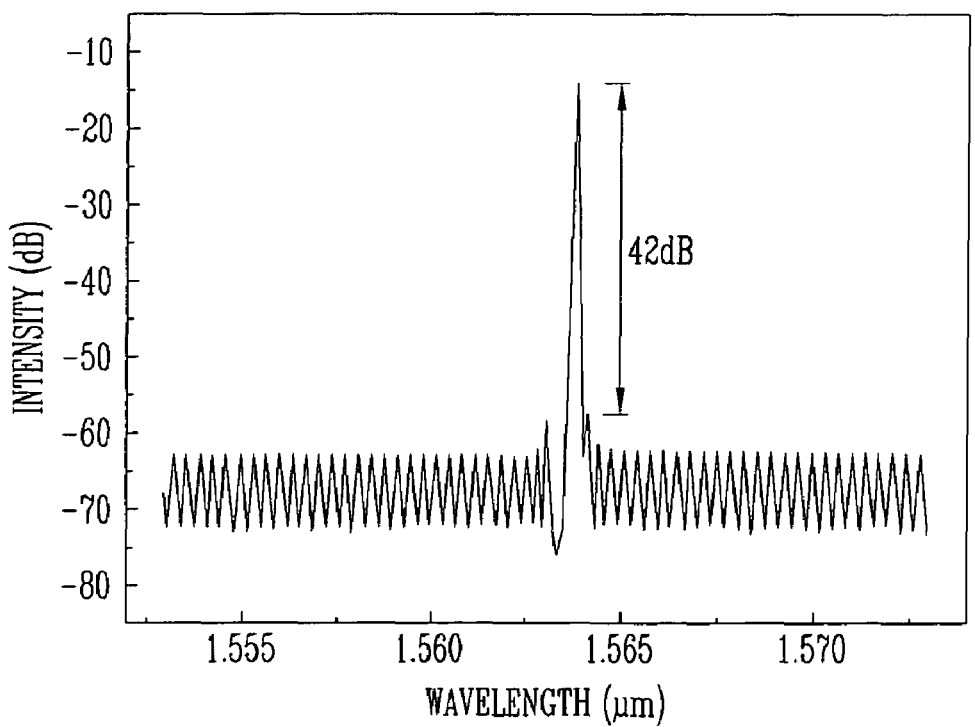
FIG. 4B is a graph showing a spectrum obtained by applying a predetermined current to a quantum dot laser diode manufactured according to an exemplary embodiment of the present invention.

FIG. 4A is a graph showing optical power as a function of applied current measured under a continuous wave (cw) condition at room temperature in a quantum dot laser diode manufactured according to an exemplary embodiment of the present invention, and FIG. 4B is a graph showing a spectrum obtained by applying a predetermined current to a quantum dot laser diode manufactured according to an exemplary embodiment of the present invention.

Referring to FIG. 4A, the variation of optical power as a function of applied current under a continuous wave condition at room temperature in a quantum dot laser diode according to an exemplary embodiment of the present invention is shown. The x-axis indicates applied current (I:mA), and the y-axis indicates optical power (power:mW). The graph of FIG. 4A illustrates the result of an experiment using a ridge-waveguide-shaped quantum dot laser diode including a quantum dot layer having In(Ga)As quantum dots and manufactured according to an exemplary embodiment of the present invention. A ridge-waveguide used in this experiment had a ridge width of 3 μm. The ridge-waveguide had been cut off to make a cavity length of 1 mm, and then the experiment was performed under the continuous wave condition at room temperature. According to the result of the experiment, optical power did not vary until current applied to the quantum dot laser diode became a predetermined value but was proportional to the applied current when the applied current became about 40 mA or more. In result, it can be seen that optical power of the quantum dot laser diode according to an exemplary embodiment of the present invention is proportional to applied current, stable and uniform.

Referring to FIG. 4B, the spectrum of a quantum dot laser diode measured under the same condition of FIG. 4A according to an exemplary embodiment of the present invention is shown. In FIG. 4B, the x-axis indicates wavelength (μm), and the y-axis indicates intensity (dB). From the spectrum of FIG. 4B, it can be seen that relatively high gain can be obtained at a desired emission wavelength. In this embodiment, an extraordinary intensity of about −15 dB is shown at a wavelength of about 1.564 μm in comparison with other wavelength. The value is higher than that of any other wavelength by about 42 dB. Consequently, when a quantum dot laser diode according to an exemplary embodiment of the present invention is used, relatively high gain can be obtained at a desired wavelength and device characteristics can be improved.

As described above, it is possible to provide a quantum dot laser diode showing excellent gain at a desired wavelength without affecting quantum dot uniformity by forming a grating structure under quantum dots, i.e., adopting gratings (structure) as a variable affecting a quantum dot active layer.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of manufacturing a quantum dot laser diode, the method comprising:
    forming a grating structure layer including a plurality of equally spaced gratings within the grating structure layer on a substrate, and
    wherein the plurality of gratings are configured for injecting photons and leading a stimulated emission to the top of the grating structure layer;
    forming a first lattice-matched layer on the grating structure layer;
    forming at least one quantum dot layer having at least quantum dot on the first lattice-matched layer;
    forming a second lattice-matched layer on the quantum dot layer;
    forming a cladding layer on the second lattice-matched layer; and
    forming an ohmic contact layer on the cladding layer,
    wherein the second lattice-matched layer is the same as the first lattice-matched layer in structure and function.

2. The method of claim 1, wherein in the forming at least one quantum dot layer, the at least one quantum dot layer is formed by one of a metal-organic chemical vapor deposition (MOCVD) method, a molecular beam epitaxy (MBE) method, and a chemical beam epitaxy (CBE) method.

3. The method of claim 2, wherein the quantum dot is formed of In(Ga)As.

4. The method of claim 1, wherein in the forming the first and second lattice-matched layers, the first and second lattice-matched layers are formed of a group III-V compound.

5. The method of claim 1, wherein when the first and second lattice-matched layers are formed to symmetrically or asymmetrically surround the quantum dot.

* * * * *